United States Patent [19]

Maas et al.

[11] 4,449,287
[45] May 22, 1984

[54] METHOD OF PROVIDING A NARROW GROOVE OR SLOT IN A SUBSTRATE REGION, IN PARTICULAR A SEMICONDUCTOR SUBSTRATE REGION

[75] Inventors: Henricus G. R. Maas; Johannes A. Appels, both of Eindhoven, Netherlands

[73] Assignee: U.S. Philips Corporation, New York, N.Y.

[21] Appl. No.: 447,844

[22] Filed: Dec. 8, 1982

[30] Foreign Application Priority Data

Dec. 10, 1981 [NL] Netherlands .......................... 8105559

[51] Int. Cl.³ ......................................... H01L 21/302
[52] U.S. Cl. ...................................... 29/580; 29/571; 156/653; 156/648
[58] Field of Search .................... 29/571, 580, 576 W; 156/653, 648, 657, 662; 357/55, 34; 148/1.5

[56] References Cited

U.S. PATENT DOCUMENTS

4,209,349 6/1980 Ho et al. ........................ 156/653 X
4,274,909 6/1981 Venkataraman et al. ........ 29/528 X Primary Examiner—Brian E. Hearn
Assistant Examiner—David A. Hey
Attorney, Agent, or Firm—Paul R. Miller

[57] ABSTRACT

According to the invention, at least one oxidation-preventing layer (2) is provided on the substrate region (1), while on this layer there is provided an oxidizable layer (3). The oxidizable layer (3) is removed above part of the substrate region (1). An edge portion (5) of the oxidizable layer (3) is oxidized. Subsequently, at least the uncovered part of the oxidation-preventing layer (2) is removed selectively and the exposed part of the substrate region is thermally oxidized through part of its thickness, while practically only at the area of the oxidized edge portion (5) the substrate region (1) is exposed and is etched away through at least part of its thickness in order to form a groove (8), the oxidizable layer (3) and the oxidized edge portion (5) being removed completely. The substrate region may be a mono- or polycrystalline silicon layer. The oxidizable layer may consist of for instance polycrystalline silicon and may be coated with a second oxidation-preventing layer (4). If the substrate region is a masking layer, the slots provided therein may be used for doping purposes, for example, for forming channel stoppers, etc.

Application in particular for the manufacture of integrated circuits and of gate electrodes spaced apart by very small distances in IGFET and CCD structures.

FIG. 9 is suitable for abridgment.

20 Claims, 54 Drawing Figures

METHOD OF PROVIDING A NARROW GROOVE OR SLOT IN A SUBSTRATE REGION, IN PARTICULAR A SEMICONDUCTOR SUBSTRATE REGION

The invention relates to a method of providing a narrow groove in a substrate region, the width of the groove being determined in a self-aligning manner.

The invention further relates to a device having a substrate region comprising a narrow groove or slot, which is manufactured by the use of the method.

The advancing developement of integrated circuits and the technology used therein involve increasingly higher requirements with respect to the packing density, which results in that ever smaller dimensions of the separate construction elements of the circuit arrangement are aimed at. In most cases, use is then made of photolithographic etching methods. However, a lower limit for the dimensions to be obtained is reached already soon. This limit is determined inter alia by the resolution of the photosensitive lacquer used in these techniques. Some improvement in this respect can be obtained by the use of lacquers which are sensitive to ultraviolet, X-ray or electron radiation, but even then the disadvantage subsists that frequently several masks have to be successively aligned with respect to each other. In this case, tolerances have to be taken into account which again set a limit to the minimum attainable dimensions.

The latter disadvantage can be avoided for the major part by providing the semiconductor zones, contact windows and metallization in a self-aligning manner, that is to say that a series of successive operations is carried out, none of which requires the alignment of a pattern with respect to a pattern which already has been provided earlier.

A method of the kind described in the preamble, in which a narrow slot is provided in a substrate region consisting of a polycrystalline silicon layer, is known from Proceedings of the I.E.E.E., International Solid State Circuits Conference, February 1981, p. 216–217.

In this method, the width of the slot is determined by an underetching process with the use of a selective etching liquid. The use of such a "wet" underetching method has, however, great disadvantages, such as inter alia the risk that contaminations remain in the cavity obtained by underetching, and in general yields a non-reproducible or hardly reproducible result.

The invention has inter alia for its object to provide a method of providing in a self-aligning manner a narrow groove or slot in a substrate region without the need of underetching with the aid of an etching liquid and without the necessity of carrying out complicated etching methods.

The invention is based inter alia on the recognition of the fact that this can be achieved by the use of a layer of an oxidizable material which temporarily acts as an auxiliary layer and is removed in the course of the process.

According to the invention a method of the kind described in the preamble is therefore characterized in that on a surface of the substrate region there is provided at least one oxidation-preventing layer and on this layer an oxidizable layer, in that the oxidizable layer is removed selectively above part of the surface of the substrate region, whereupon an edge portion of the remaining part of the oxidizable layer is selectively oxidized throughout its thickness, the remaining part of the oxidizable layer being oxidized at most only through part of its thickness, and in that then at least the uncovered part of the oxidation-preventing layer is selectively removed, the exposed part of the substrate region is thermally oxidized through part of its thickness, and the substrate region is exposed in a self-aligning manner substantially only at the area of the oxidized edge portion and is etched away through at least part of its thickness to obtain said groove, the said remaining part of the oxidizable layer inclusive of the oxidized edge portion being removed.

The method according to the invention has the great advantage that the oxidized edge portion already obtained at an early stage of the process, which may have very small dimensions (smaller than 1 μm), defines the width ultimately obtained of the slot or groove without further accurate aligning and masking steps being necessary. Moreover, with the use of the method according to the invention of manufacturing a semiconductor device, this oxidized edge portion can also define the positions of further active and passive parts of the device, for example, of diffusions and contacts, as will be explained more fully hereinafter.

The narrow substrate part, which is destined for etching the groove, can be exposed in a self-aligning manner by various methods. According to a first important preferred embodiment, after the uncovered part of the oxidation- preventing layer has been removed, the oxidized part of the oxidizable layer is etched away completely, whereupon, simultaneously with the thermal oxidation of the exposed part of the substrate region, the remaining part of the oxidizable layer is oxidized completely and the underlying part of the substrate region is exposed by removal of the uncovered part of the oxidation-preventing layer. Simultaneously with the formation of the oxidized edge portion, the remaining part of the oxidizable layer can also be oxidized in part.

According to another embodiment, however, in the first instance only an edge portion of the oxidizable layer is oxidized. For this purpose, there is provided on the oxidizable layer a second oxidation-preventing layer, which during the oxidation of the said edge portion protects the remaining part of the oxidizable layer from oxidation.

The oxidized edge portion can be maintained during the major part of the process. This is the case in a preferred embodiment, in which after the said thermal oxidation of the exposed part of the substrate region, the second oxidation-preventing layer and the underlying oxidizable layer are removed, whereupon the part of the first oxidation-preventing layer thus exposed is removed, after which the oxidized edge portion and the thermal oxide layer on the substrate region are etched away, whereupon the substrate region is again thermally oxidized and the underlying part of the substrate region is exposed by removal of the uncovered part of the first oxidation-preventing layer.

However, the oxidized edge portion may alternatively be removed at an early stage without adversely affecting the self-aligning definition of the groove width. Thus, according to another important preferred embodiment, the oxidized edge portion is etched away already after the removal of the uncovered part of the first oxidation-preventing layer and the second oxidation-preventing layer is removed after the thermal oxidation of the substrate region, whereupon during etching of the groove in the exposed part of the substrate region the oxidizable layer is also etched away.

Another modification of the method according to the invention is characterized in that after the formation of the oxidized edge portion the second oxidation-preventing layer is etched away completely and the first oxidation-preventing layer over only part of its thickness, in that then the oxidizable layer is etched away selectively, in that subsequently the parts of the first oxidation-preventing layer which are not located under the oxidized edge portion are removed, whereupon the oxidized edge portion is etched away, and in that then the exposed part of the substrate region is oxidized, whereupon the remaining part of the first oxidation-preventing layer is etched away selectively.

Although the method according to the invention is of particular importance for the manufacture of a semiconductor device, it is equally suitable, when use is made of non-semiconductive substrate materials, to be utilized for providing narrow grooves in other materials, for example, in a synthetic resin or in a metal.

The groove may extend through only part of the thickness of the substrate region. However, when the substrate region is a layer provided on a support, the groove may extend advantageously throughout the thickness of this layer, thus forming a slot-shaped aperture.

The invention will be described more fully with reference to the drawing, in which FIGS. 1 to 9 are diagrammatic cross-sectional views of a semiconductor device in successive stages of manufacture according to a first embodiment of the method in accordance with the invention;

Figure 52:
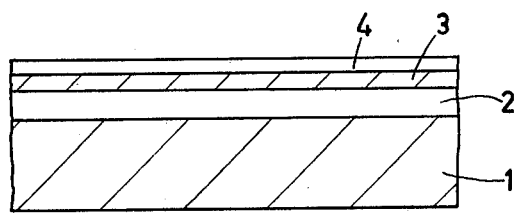
Figure 53:
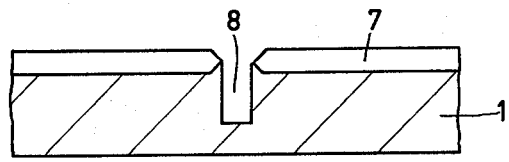
Figure 54:
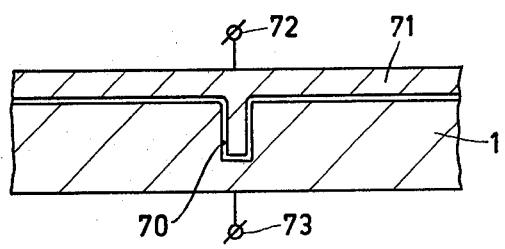
Figure 33:
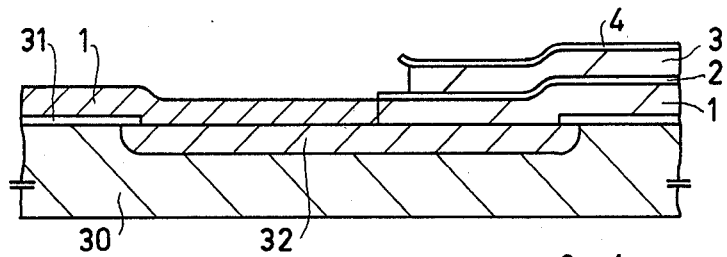
Figure 34:
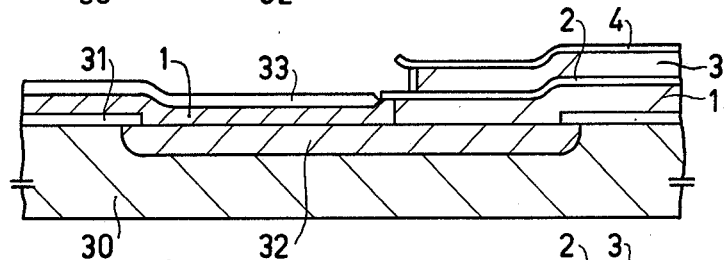
Figure 35:
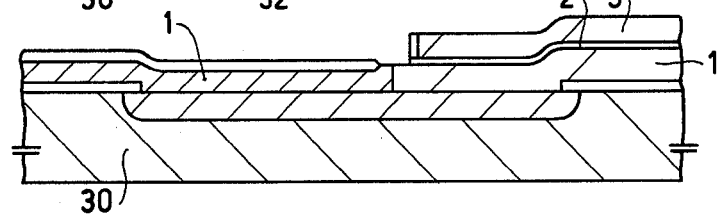

FIGS. 39 to 45 are diagrammatic cross-sectional views of other details during the stages of manufacture according to the embodiment of FIGS. 33 to 38, FIGS. 46 to 51 inclusive show diagrammatically in cross-section the manufacture of a charge-coupled field effect device according to the invention, and FIGS. 52 to 54 show an application of the method according to the invention outside the field of semiconductor technology.

The figures are purely diagrammatic and are not drawn to scale.

Corresponding parts are generally denoted by the same reference numerals.

FIGS. 1 to 9 are diagrammatic cross-sectional views of successive stages of the manufacture of a semiconductor device according to the method in accordance with the invention.

Figure 1:
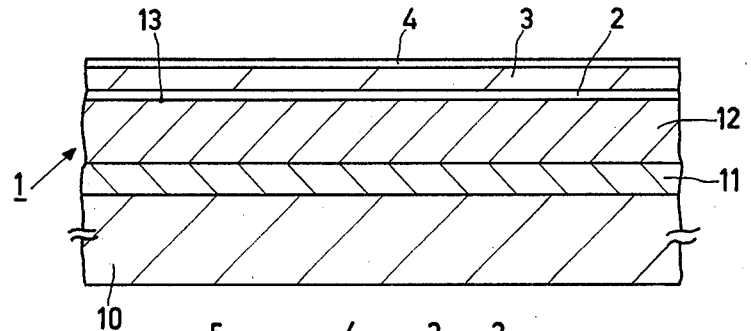
Figure 2:
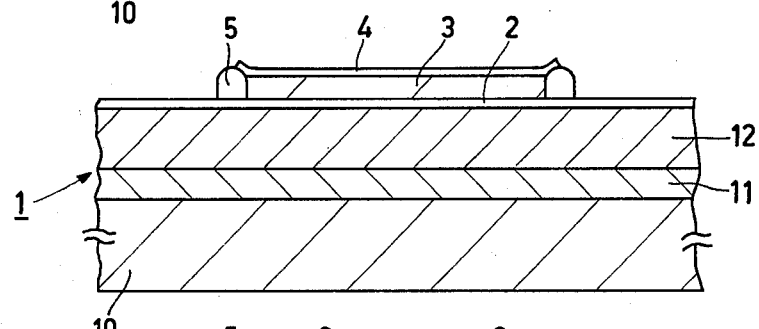

In this example, the invention is used to insulate laterally an island-shaped part of an epitaxial layer by means of very narrow oxide regions. Starting material is a substrate region, which in this example is constituted by a silicon body having a p-type region 10, an n-type buried layer 11 and a juxtaposed p-type epitaxial layer 12. On a surface 13 of the substrate region 1 an oxidation-preventing layer 2 is present, which in this example is a silicon nitride layer. On this layer an oxidizable layer 3 is deposited, which in this case is a layer of polycrystalline silicon. Although this is not always necessary, as will be apparent from a following example, in this example a second oxidation-preventing layer 4, which in this case likewise is a silicon nitride layer, is provided on the layer 3. The situation according to FIG. 1 is then obtained.

The oxidizable layer 3 is now removed above part of the surface 13. For this purpose, first the silicon nitride layer 4 is partially etched away, whereupon the part of the layer 3 thus exposed is removed completely by etching or by oxidizing and etching away the oxide. The edge of the remaining part of the layer 3 is then subjected to a thermal oxidation, as a result of which an edge portion 5 of the layer 3 is oxidized throughout its thickness, see FIG. 2.

Figure 3:
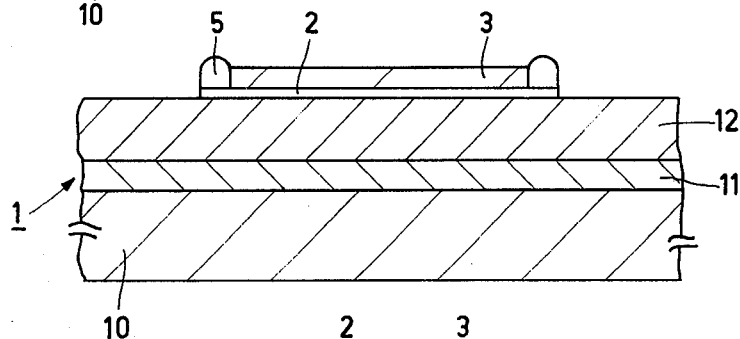

Subsequently, the remaining part of the layer 4 and the uncovered part of the first oxidation-preventing layer 2 are removed, see FIG. 3. The substrate region is then exposed and etched practically only at the area of the oxidized edge portion 5 in a self-aligning manner. In this example, this is effected in the following manner.

Figure 4:
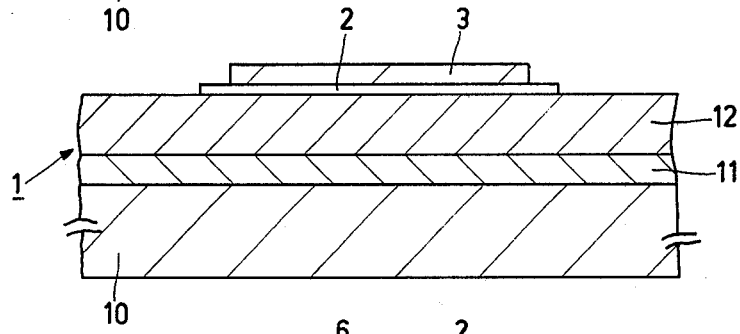
Figure 5:
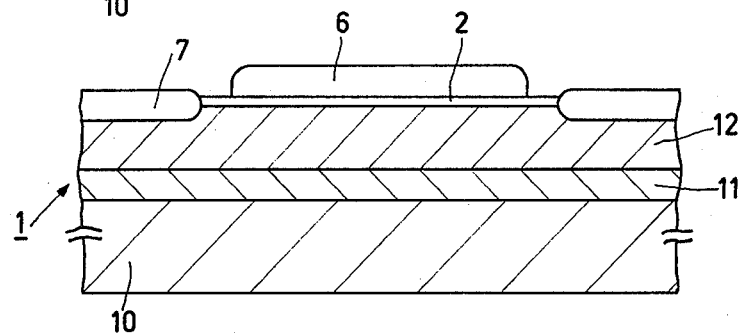
Figure 6:
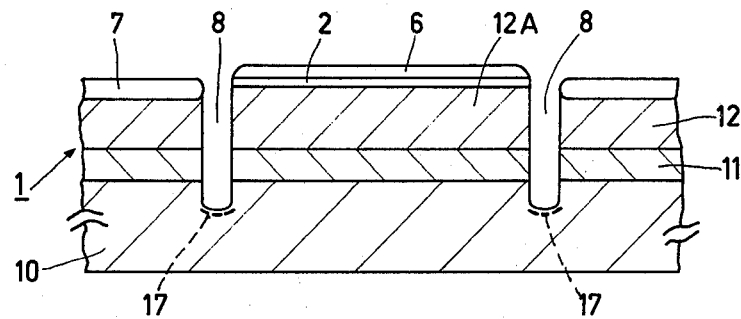
Figure 7:
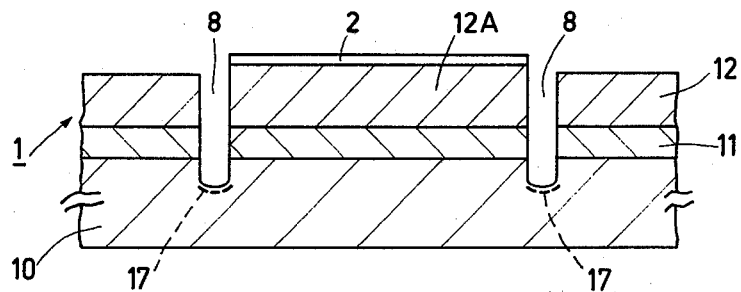

After the oxidized edge portion 5 has been etched away, which results in the situation of FIG. 4, the exposed part of the substrate region 1 is thermally oxidized through part of the thickness of the layer 12. During this thermal oxidation, the silicon layer 3 is also oxidized throughout its thickness. Thus, the oxide layers 6 and 7 are formed, see FIG. 5. Subsequently, the part of the silicon nitride layer 2 remaining between the oxide layers 6 and 7 is etched away selectively so that at the area of the oxidized edge portion 5 of the layer 3, which has been removed earlier, the substrate region is exposed. By means of plasma-etching a groove 8 having substantially vertical walls is now etched into the very narrow exposed part of the substrate region, which may have a width of less than 1 μm, which groove completely surrounds laterally an island-shaped part 12A of the epitaxial layer 12 and extends through the buried layer 11, see FIG. 6.

Figure 8:
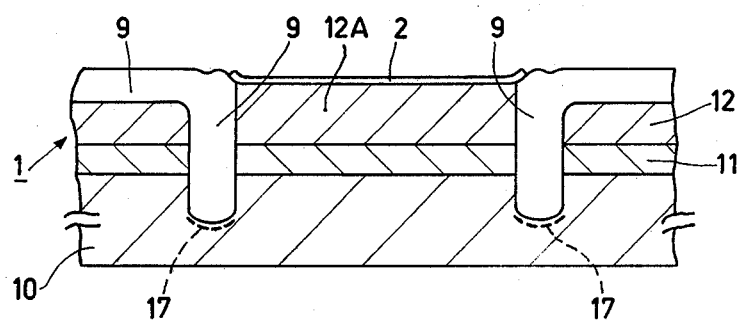
Figure 9:
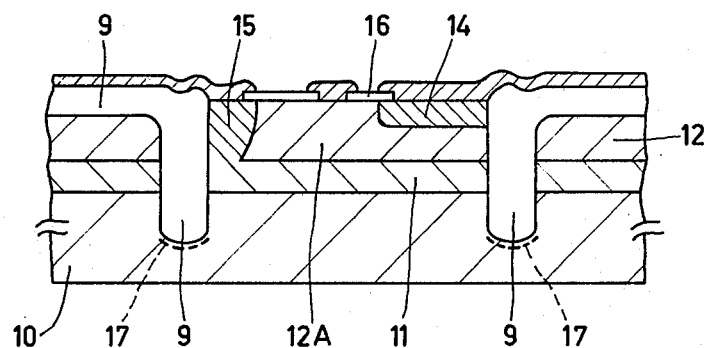
Figure 10:
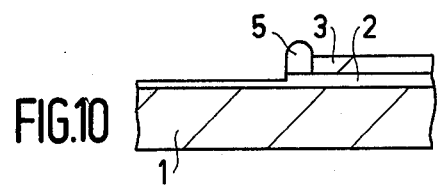
FIGS. 10 to 15 are diagrammatic cross-sectional views of a semiconductor device in successive stages of manufacture according to a modification of the embodiment of FIGS. 1 to 9.
Figure 13:
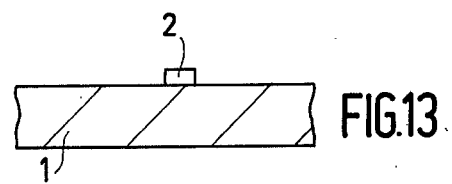
Figure 11:
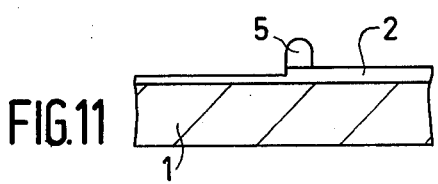

After the oxide layers 6 and 7 have been etched away (see FIG. 7), a thermal oxidation is now carried out, in which the groove 8 is filled completely with oxide and a thick field oxide layer 9 is formed in the groove 8 and outside the island 12A (FIG. 8).

After the silicon nitride layer 2 has been etched away selectively, a semiconductor circuit element, for example, a transistor having a collector zone 11, a base zone 12A and an n-type emitter zone 14 as well as a collector connecting zone 15 can be formed in the island 12A by the use of methods generally known in the semiconductor technique. The contact windows can then be provided in a thin oxide layer 16. The step of etching contact windows through the thick field oxide can be avoided due to the presence of the nitride layer 2 during the process of filling the groove 8 with oxide.

Since silicon oxide, silicon nitride and silicon can be etched selectively with respect to each other, only the part of the substrate region 1, that is to say of its upper epitaxial layer 12, located below the oxidized edge portion 5, was exposed and etched away through part of the substrate thickness in the process described without masking and aligning steps, fully in a self-aligning manner, the remaining part of the oxidizable layer 3 and the oxide edge portion 5 being removed.

The oxide regions 9 formed in the grooves 8 may be narrower than 1 μm and consequently very much narrower than the usual diffused or dielectric separation regions. This results in a considerable increase of the compactness of the circuit arrangement, which may comprise a large number of islands of the structure of FIG. 9 having a large number of semiconductor circuit elements.

The choice of the various layer thicknesses and etching methods can be left entirely to those skilled in the art and depends on the desired application. In this example, the thickness of the layer 2 was 75 nm, that of the layer 3 was 0.35 μm and that of the layer 4 was 150 nm. The width of the grooves 8 was 0.5 μm and their depth 7 μm. The epitaxial layer 12 had a thickness of 3 μm and the buried layer 11 was 3 μm thick.

As a selective etchant for silicon nitride hot phosphoric acid (140° C.–180° C.), as a selective etchant for silicon oxide a buffered HF-solution in waterand as a selective etchant for polycrystalline silicon KOH in water (20% by weight) may be used, for example. The process of etching the grooves 8 may be carried out, for example, in a CCl$_4$-chlorine plasma at a frequency of, for example, 13.56 MHz, a pressure of 0.3 Pa and a power of 3000 W.

Instead of a transistor having an epitaxial base zone, it is of course possible to form a transistor having a diffused or implanted p-type base zone when, for example, the layer 12 is not p-type but n-type conducting and serves as collector zone, the highly doped n-type buried layer 11 then forming in the usual manner the buried collector connection, which is contacted through the zone 15 on the upper surface.

Figure 14:
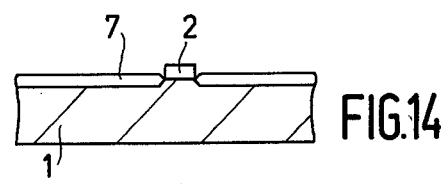
Figure 12:
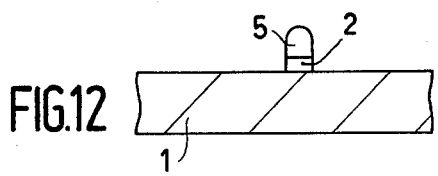
Figure 15:
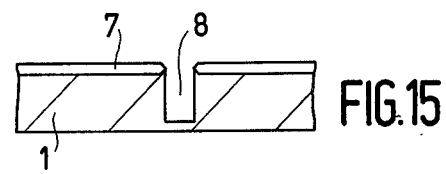

A possible modification of the example of FIGS. 1 to 9 is shown diagrammatically in FIGS. 10 to 15. Due to the fact that in this modification the silicon nitride layer 4 is chosen to be thinner than the layer 2, the uncovered part of the layer 2 is partly maintained after the layer 4 has been etched away; see FIG. 10, which corresponds to the stage of FIG. 3 of the preceding example. The silicon layer 3 is then etched away selectively (FIG. 11), whereupon the uncovered silicon nitride is completely removed (FIG. 12). After the oxidized edge portion 5 has been etched away (FIG. 13), the oxide layer 7 is formed by thermal oxidation (FIG. 14). The silicon nitride 2 is then selectively etched away and the groove 8 is etched into the part thus exposed of the substrate 1. (FIG. 15) This modification has the disadvantage, however, that, after the groove 8 has been filled with oxide, the thick field oxide is formed non both sides of the groove, which may give rise to problems for the formation and contacting of doped semiconductor zones of semiconductor circuit elements to be provided afterwards. For certain other applications, for example, when the substrate 1 is a silicon layer provided on a support and is fully traversed by the groove 8, this modification may be advantageous however, since in technological respect it is somewhat simpler. In this case, for example, the parts of the substrate region 1 on both sides of the groove are subjected to the same thermal oxidation so that they ultimately obtain the same thickness. This in contrast with the example of FIGS. 1 to 9, in which in the final stage (FIG. 9) the epitaxial layer 12 is thicker at the area of the region 12A than beside it.

Another preferred embodiment, in which a second oxidation-preventing layer on the oxidizable layer 3 can be dispensed with, will now be described with reference to FIGS. 16 to 23. In this example and in a few following examples, the method according to the invention will be explained with reference to the manufacture of a small bipolar transistor. However, it should be appreciated that the invention may be also utilized advantageously in the manufacture of other semiconductor circuit elements.

Figure 16:
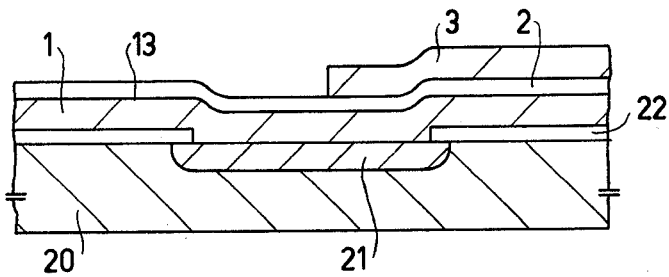
FIGS. 16 to 23 are diagrammatic cross-sectional views of successive stages of the manufacture of a semiconductor device according to another preferred embodiment.

Starting material is a supporting body 20 of n-type silicon, into which a p-type base zone 21 is diffused through a window in a silicon oxide layer 22. A layer of polycrystalline silicon 1 is deposited on the insulating layer 22 and within the window on the base zone 21. In the present example, the silicon layer 1 constitutes the substrate region 1 and is not or only weakly doped. An oxidation-preventing layer 2 of silicon nitride is provided on the layer 1 while on this layer 2 again an oxidizable layer 3 is present, which in this example also consists of silicon. After part of the oxidizable layer 3 has been removed, the situation according to FIG. 16 is obtained.

Figure 17:
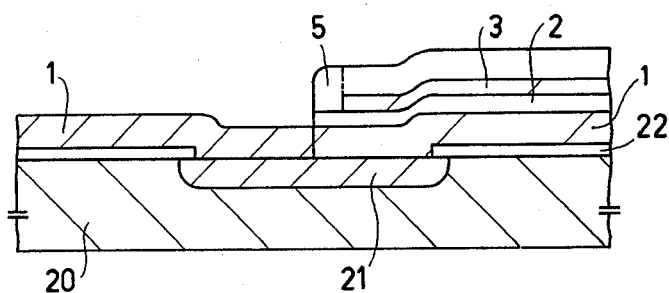

Just like in the preceding examples, an edge portion 5 of the layer 3 is now oxidized throughout its thickness. Since the layer 3 is uncovered, also the remaining part of the silicon layer 3 is oxidized through part of its thickness during this oxidation. The uncovered part of the oxidation-preventing layer 2 is then removed so that the structure of FIG. 17 is obtained. The boundary of the fully oxidized edge portion 5 is indicated by dotted lines.

At this stage, the exposed part of the layer 1 can be doped. In thin example, this is effected by means of a boron ion implantation which renders the exposed part of the layer 1 strongly p-type conducting, while the remaining part of the layer 1 is masked against this ion implantation by the overlying layers. The dose and the energy of the implantation can be suitably chosen for each particular case by those skilled in the art.

Figure 18:
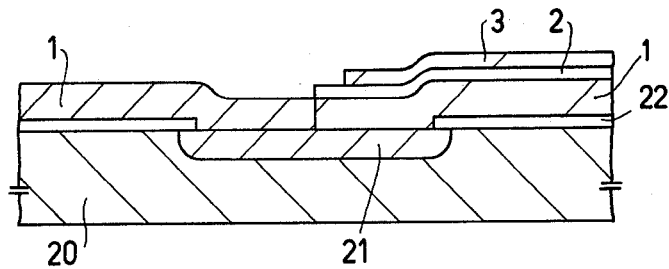
Figure 19:
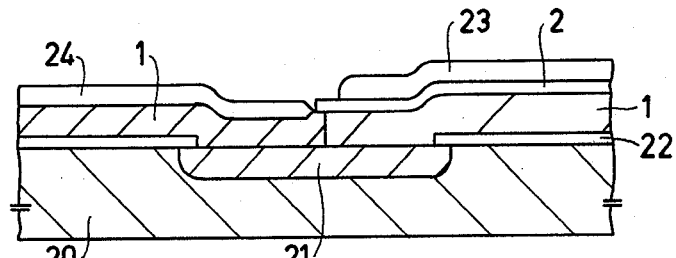

The oxide is then removed, see FIG. 18. Subsequently, again a thermal oxidation is carried out, in which the entire remaining part of the silicon layer 3 is converted into oxide 23. Also an oxide layer 24 is then formed on the uncovered part of the silicon layer, see FIG. 19.

Figure 20:
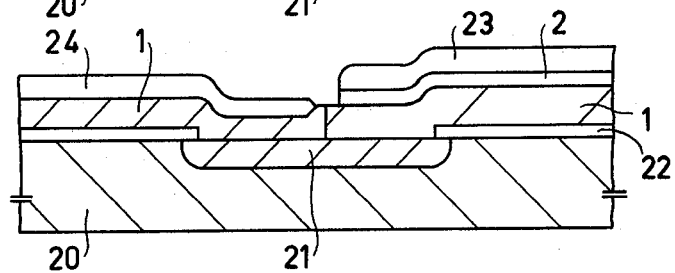
Figure 21:
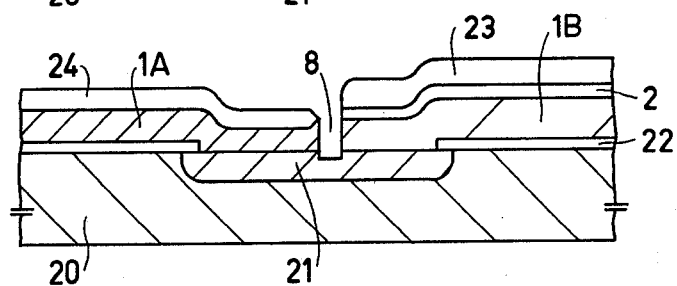
Figure 22:
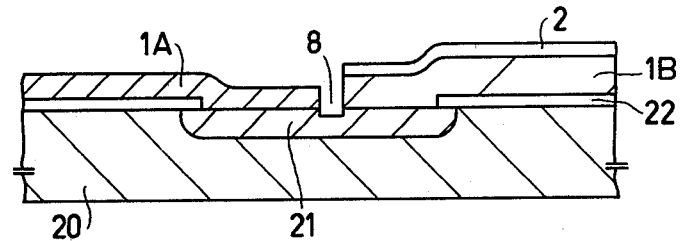
Figure 23:
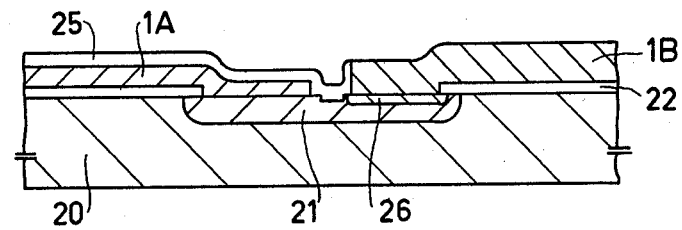

The uncovered part of the silicon nitride layer 2 is then etched away, see FIG. 20, and by plasma-etching a groove 8 is formed with the use of the layers 2, 23 and 24 as a mask, which groove extends throughout the thickness of the layer 1. The layer 1 is thus divided into two layer parts 1A and 1B, see FIG. 21. Subsequently, the oxide 23 and 24 is etched away (FIG. 22), whereupon by thermal oxidation the layer part 1A and the wall of the groove 8 are coated with an oxide layer 25, see FIG. 23. After the silicon nitride layer 2 has been removed, the n-type emitter zone 26 can be formed by diffusion or implantation, the layer part 1B at the same time obtaining a high n-type doping. The transistor thus obtained has low-ohmic polycrystalline emitter and base connections. The collector connection may be provided elsewhere on the collector region 20 (not shown here).

FIGS. 24 to 31 are diagrammatic cross-sectional views of successive stages of the manufacture of a semiconductor device according to a further preferred embodiment of the method in accordance with the invention.

In this example, again the manufacture of a bipolar transistor is described. Only the part of the semiconductor device to be manufactured in which the transistor is formed is shown in the Figures.

Starting material is a supporting body, which in this example is constituted by an n-type silicon region 30, which partly is coated with a silicon oxide layer 31. A window is provided in the layer 31 and through this window a p-type base zone 32 is formed by diffusion or ion implantation. With the use of deposition methods known in the semiconductor technique this supporting body is provided successively with a first silicon layer 1 serving as the substrate region, a juxtaposed oxidation-preventing layer 2, in the present example a silicon nitride layer, and a juxtaposed oxidizable layer 3, in the present example a second silicon layer. In the present example, the second silicon layer 3 is moreover provided with a second oxidation preventing layer 4 having a larger thickness than the layer 2 and in this example also consisting of silicon nitride. It should further be noted that in this example, just like in the preceding examples, sometimes a further very thin oxide layer not shown herein is provided between the silicon nitride layers 2 and 4 and the underlying silicon layers 1 and 3, respectively. In this example, the layers 1 and 3 are substantially undoped polycrystalline silicon layers having a thickness of 0.5 µm and 0.35 µm and 0.35 µm, respectively. The nitride layers 2 and 4 have a thickness of 75 nm and 150 nm, respectively.

Figure 24:
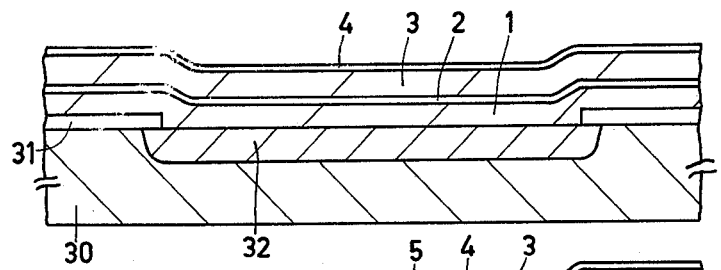
FIGS. 24 to 31 are diagrammatic cross-sectional views of successive stages of the manufacture of a semiconductor device according to a further preferred embodiment.

By these steps the situation of FIG. 24 is obtained.

Figure 25:
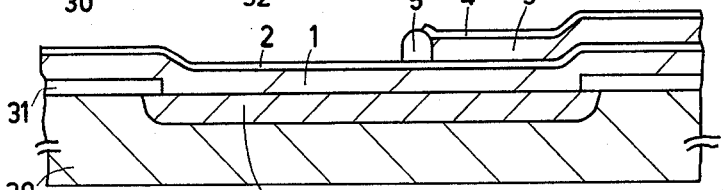

By successively etching the layers 4 and 3, during which treatment a photolacquer mask can be used as the etching mask, the second silicon layer 3 is removed above part of the surface of the layer 1, whereupon an edge portion 5 of the remaining part of the oxidizable silicon layer 3 is oxidized throughout its thickness, see FIG. 25. The silicon nitride layers 2 and 4 protect the underlying silicon layers 1 and 3 against oxidation. In this example, the oxidized edge portion 5 has a width of approximately 0.9 µm.

Subsequently, (see FIG. 26) the uncovered part of the first oxidation-preventing layer 2 (inclusive of any underlying very thin oxide layer) is removed. The nitride layer 4 is then partly maintained, because it is thicker than the layer 2. Subsequently (see FIG. 27) the exposed part of the first silicon layer 1 is oxidized through part of its thickness by heating in an oxygen-containing atmosphere, as a result of which a thermal oxide layer 33 is formed having a thickness of, for example, 0.15 µm.

Also in this case the substrate region, so here the first silicon layer 1, is then exposed and etched away practically only at the area of the oxidized edge portion 5 in a self-aligning manner, the remaining part of the oxidizable layer, here the silicon layer 3, inclusive of the oxidized edge portion being removed. In this example, this is effected in the following manner.

Figure 28:
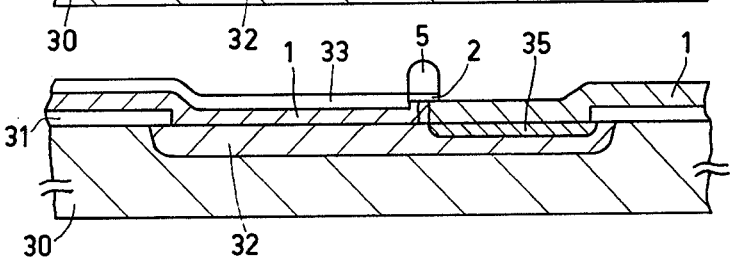

First the second oxidation-preventing layer 4 and the underlying second silicon layer 3 are successively removed by etching, whereupon also the part of the first oxidation-preventing layer 2 thus exposed is removed. Thus, the situation of FIG. 28 is obtained. Subsequently, the oxidized edge portion 5 and the thermal oxide layer 33 are etched away at the same time, which results in the structure shown in FIG. 29. Then the entire silicon layer 1 is again provided with a thermal oxide layer 34, the part of the layer 2 originally located below the oxide edge 5 masking against this thermal oxidation. This remaining part of the layer 2 is then etched away selectively, whereupon the underlying part of the silicon layer 1 is removed by etching. The groove obtained so extends in this case throughout the thickness of the substrate region and thus constitutes a narrow slot, which divides the layer 1 in two parts 1A and 1B.

In order to form the bipolar transistor, the part of the silicon layer 1 not located below the layer 3 is doped with an acceptor, for example, with boron, after the stage shown in FIG. 25 has been reached. This may be effected by means of ion implantation (which may take place through the nitride layer 2) both at the stage of FIG. 25 and at that of FIG. 26 and by means of diffusion at the stage of FIG. 26. The highly doped p-type part of the layer 1 thus obtained forms a good ohmic contact on the p-type base zone 32. The second silicon layer 3 and the oxidized edge portion 5 of this layer serve as a mask during this doping process.

After the stage of FIG. 28 has been reached, further a donor implantation or diffusion, for example, with arsenic, is carried out. The uncovered part of the silicon layer 1 then obtains a high n-type doping. When an arsenic implantation is carried out, this process may also be effected when the layer 2 is still present. During the thermal treatments associated with this doping and also during the formation of the thermal oxide layer 34, the arsenic diffuses from the layer 1 into the base zone 32 and constitutes in this zone the emitter zone 35, see FIGS. 28-30.

Figure 29:
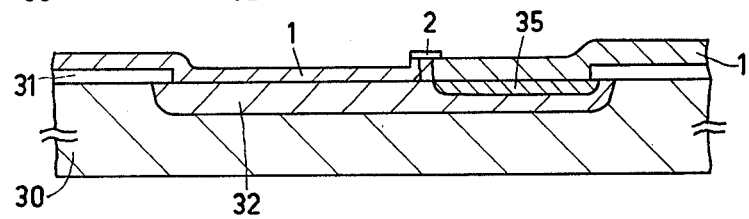
Figure 30:
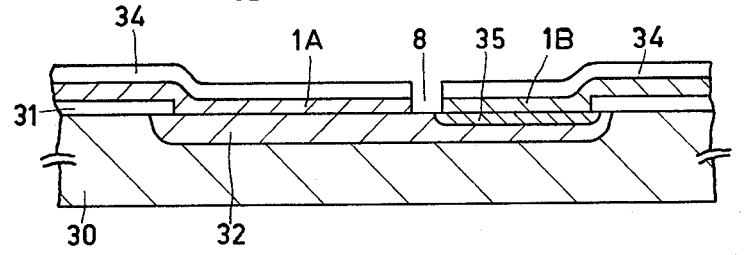

If desired, at the stage of FIG. 29, the silicon layer 1 may be entirely coated with a layer of a metal silicide, for example, platinum silicide, molybdenum silicide or another suitable silicide, in order to raise the conductivity of both the emitter and the base connection conductors. For this purpose the layer 1 is coated in the usual manner with a metal layer which is then converted into a silicide by heating. Subsequently, the metal remaining on the nitride layer 2 is removed by etching. Depending upon the thickness of the silicon layer 1, this layer 1 may be converted throughout its thickness or through part of its thickness into metal silicide.

Finally (see FIG. 31), the emitter/base junction and the edges of the silicon layer parts 1A and 1B are coated with an oxide layer 36 by thermal oxidation or pyrolytically, whereupon the collector zone 30 is provided at a suitably chosen place, in this example on the lower side, with an electrode layer 37 in a usual manner. The layer parts 1A and 1B, which constitute the base and emitter connections, and the electrode layer 37 may then be provided with connection conductors and the device may be finished in a usual manner. The collector region 30 may also be contacted on the upper side, which is to be preferred when the transistor forms part of an integrated circuit.

Figure 31:
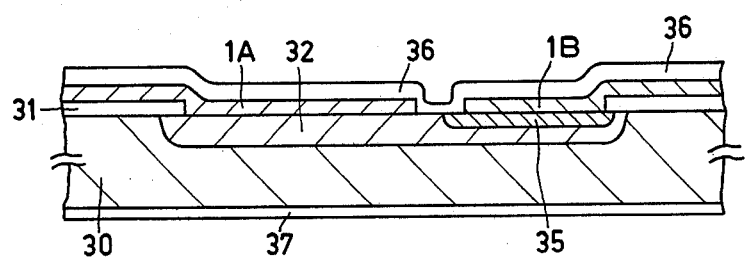

It follows from the above description that after the first non-critical masking for obtaining the structure of FIG. 25, the entire process inclusive of the stage of FIG. 31, can be carried out without the use of a mask, the distance between the silicon layer parts 1A and 1B, which constitute the base and emitter wiring, and the area of the emitter zone 35 being determined already in the beginning by the oxidized edge portion 5. By very simple means a high degree of self-alignment can thus be attained by the use of the invention.

Figure 32:
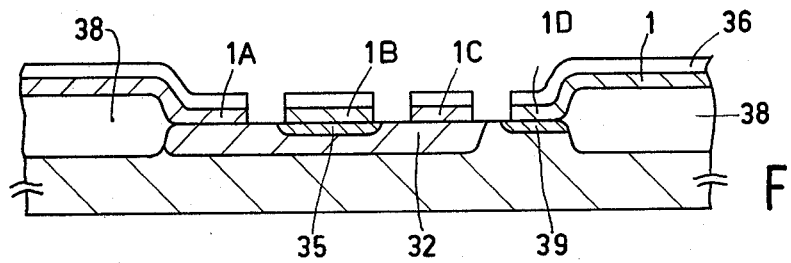
FIG. 32 shows diagrammatically in cross-section another semiconductor device manufactured according to the preferred embodiment of FIGS. 24 to 31, FIGS. 33 to 38 show a modification of the embodiment of FIGS. 24 to 31.

In the present embodiment, a transistor having only one base and emitter connection was formed, the first silicon layer 1 ultimately consisting of two layer parts spaced apart by a small distance. However, by etching the second silicon layer 3 so that at the state of FIG. 25 several parts of this layer are maintained, each of which can be provided with oxidized edge portions 5, more complicated structures may be realized, the first silicon layer 1 consisting of several parts spaced apart by a small distance. By way of example, FIG. 32 shows in cross-section a transistor structure having two base connections (1A, 1C), an emitter contact 1B and a collector contact 1D, which are all located on the upper side and all consist of parts of this first silicon layer 1, which may be realized by this method and in which a partly sunken oxide pattern 38 is used.

The silicon layer parts 1A and 1C are connected to each other elsewhere (outside the plane of the drawing). The n+-type collector contact zone 39 is provided simultaneously with the emitter zone 35 by diffusion from the overlying highly doped n-type part 1D of the layer 1.

Figure 26:
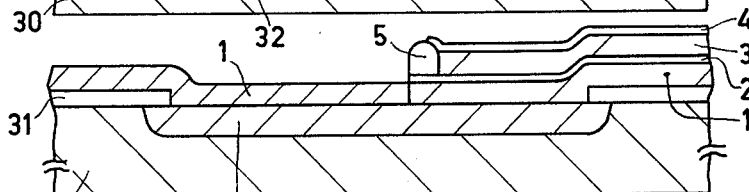
Figure 27:
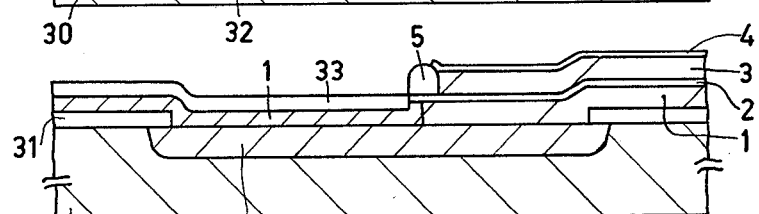
Figure 36:
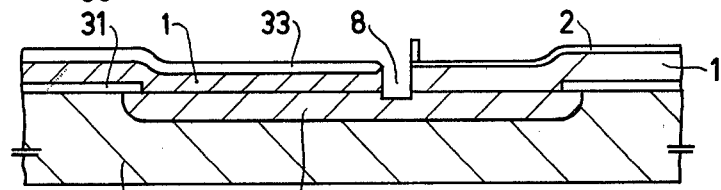
Figure 37:
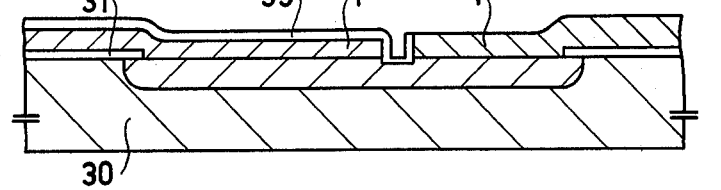
Figure 38:
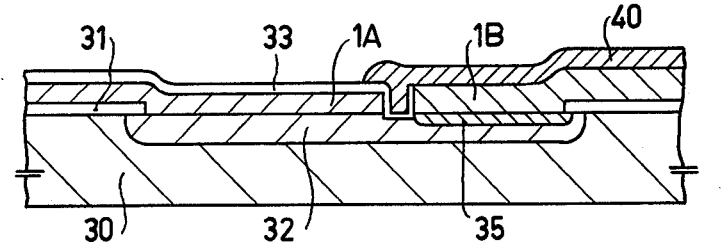
Figure 39:
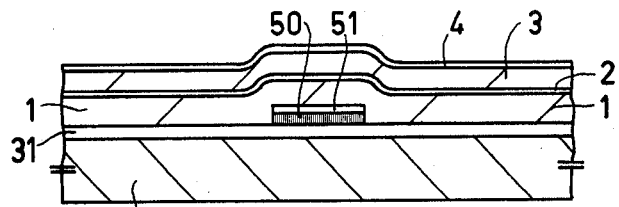

FIGS. 33 to 38 show a modification of this preferred embodiment, in which (see FIG. 33) there is started from the situation of FIG. 26, the oxidized edge portion 5 being also etched away already. After oxidation of the exposed part of the oxide layer 1, the edge of the silicon layer 3 being also slightly oxidized again (see FIG. 34), the exposed part of the silicon nitride layer 2 is etched away selectively (see FIG. 35). Subsequently, the silicon layer 3 is etched waway completely and at the same time the groove 8 is formed (FIG. 36) in the same plasma-etching step. After a slight oxidation of the walls of the groove 8, the underlying part of the silicon layer 1 is exposed by selectively etching away the silicon nitride layer 2 (FIG. 37). This part can then be doped with, for example, arsenic by diffusion or by ion implantation, the oxide layer 33 acting as a mask. The emitter zone 35 is then formed at the same time in the base zone 32 (FIG. 38). Finally, a contact layer 40, of, for example, aluminum for contacting the emitter zone is provided on the part 1B of the silicon layer 1 and on part of the oxide 33. The layer part 1A may also, if desired, be provided with a contact layer through a window in the oxide layer, while also the collector region 30 is provided with a connection at a suitable place.

With the use of the method according to the invention for the formation of narrow slots in a silicon layer forming part of the wiring and the interconnections of an integrated circuit, as in the examples of FIGS. 16 to 23, 24 to 31 and 33 to 38, at different places a p-type doped part of this silicon layer has to pass into an n-type doped part without rectifying at the junction. This case will arise, for example, when the collector zone of an npn-transistor is connected through the said silicon layer to the base zone of another npn-transistor. A very suitable manner to ensure that in the technique described in the present application the p-type and n-type silicon layer parts join each other in a non-rectifying way in such cases, will be described with reference to FIGS. 39 to 45. By way of example, there is started from the method as described in the example of FIGS. 33 to 38 (which is a modification of the example of FIGS. 24 to 31, starting at the stage of FIG. 26).

Figure 40:
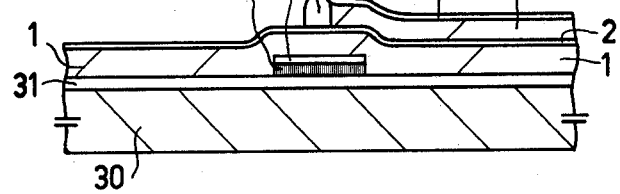
Figure 41:
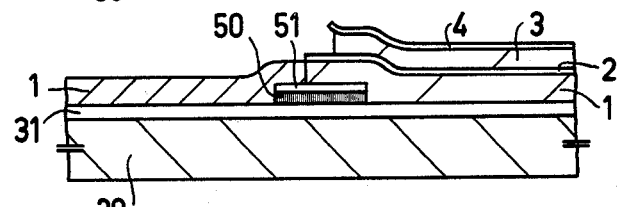
Figure 42:
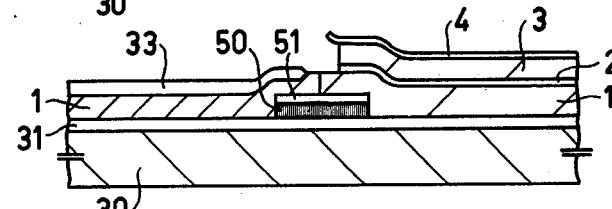

At the place at which a junction between p- and n-type silicon will be formed in the silicon layer, a small region, which consists of a metal silicide layer 50 of, for example, PtSi and which is preferably coated with an insulating layer 51 of, for example, silicon nitride or silicon oxide, is provided (see FIG. 39) before the layers 1, 2, 3 and 4 of silicon, silicon nitride, silicon and silicon nitride, respectively, are provided. This stage corresponds to that of FIG. 24. After part of the silicon layer 3 has been removed and an edge portion 5 has been oxidized, as described with reference to FIG. 25, the structure of FIG. 40 is obtained. After removing the exposed parts of the silicon nitride layer 2 and etching away the oxide region 5, the structure of FIG. 41 is obtained, which corresponds to the stage of FIG. 33. At this stage the exposed part of the silicon layer 1 is highly p-doped by implantation of boron ions.

Subsequently, this exposed part of the layer 1 (and also the edge of the layer 3) are coated by thermal oxidation with an oxide layer 33, whereupon the exposed nitride 2 is removed selectively. See FIG. 42, which corresponds to the stage of FIG. 34.

Figure 43:
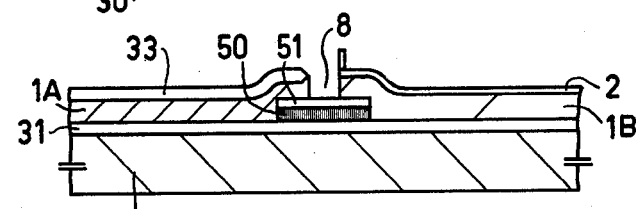

After removing the nitride layer 4, the layer 1 is etched through, for example, by means of plasma-etching, up to the layer 51, in which process the groove or slot 8 is formed; see FIG. 43, which corresponds to the stage of FIG. 36. The silicon layer 3 is then also etched away completely.

Figure 44:
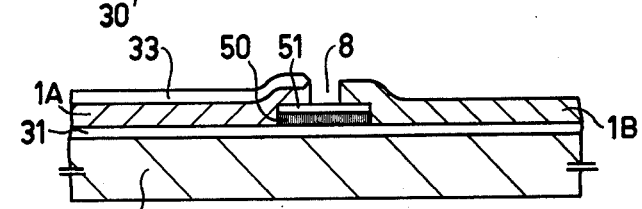
Figure 45:
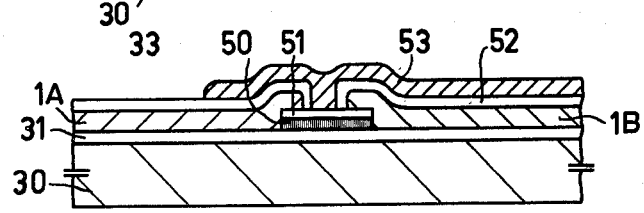
Figure 46:
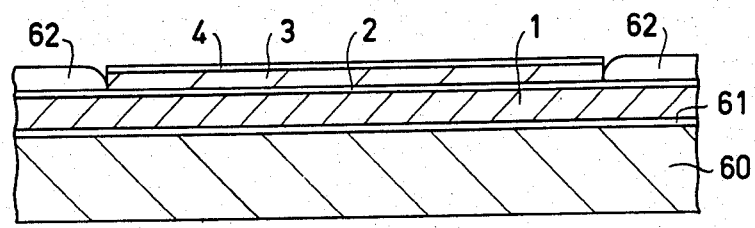
Figure 47:
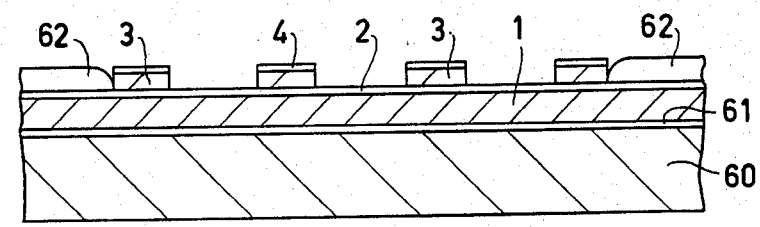
Figure 48:
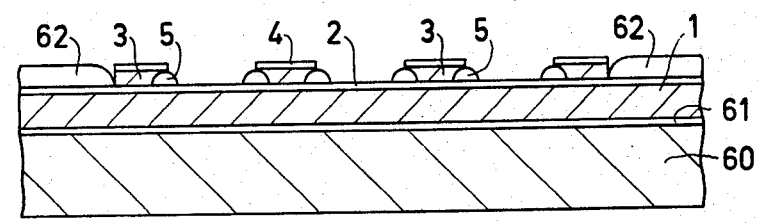

After removing the remaining parts of the silicon nitride layer 2, the part of the silicon layer 1 thus exposed is rendered strongly n-type conducting by, for example, a phosphorus ion implantation, the oxide layer 33 masking against this implantation. Thus, the structure of FIG. 44 is obtained. Subsequently, the n-type layer 1 is slightly oxidized (oxide layer 52), whereupon, if desired, a second metallization layer 53 may be provided without objection, which is completely insulated from the layer 1, while a good ohmic junction has been formed between the p- and n-type parts of the layer 1 through the metal silicide 50. The structure ultimately obtained is that shown in FIG. 45, which corresponds to the stage of of FIG. 38 (the oxide 52 of the layer part 1B of course being etched away, in order to establish contact with the metal layer 40). The insulating layer 51 may be omitted when the metal silicide 50 is capable of withstanding the etching process by means of which the groove 8 is provided and when there is no objection against contact between the layers 1 and 53 (or when the layer 53 is absent).

Although the embodiments described hitherto are all related to the manufacture of bipolar semiconductor devices, the invention is not limited thereto. Alternatively, by the use of the method according to the invention, field effect devices such as, for example, field effect transistors having two or more insulated gate electrodes, charge-coupled devices (CCD's), junction field effect transistors (JFET's) and the like may be manufactured successfully, briefly, in all cases in which one or more very narrow grooves or slots are to be provided in a substrate or a layer, respectively.

The manufacture of a field effect device having a plurality of insulated gate electrodes spaced apart by very small distances will be described by way of example with reference to FIGS. 46 to 51 inclusive. In this example, there is grown onto a supporting body 60 of n-type silicon a thermal oxide layer 61 (the gate oxide). On this layer is provided a polycrystalline silicon layer 1 of 500 nm thickness, which, for example, by diffusion, is rendered strongly n-type conducting. On the layer 1 there is produced an oxidation-preventing layer 2 of, for example, silicon nitride and on this layer there is formed a polycrystalline silicon layer 3 of approximately 50 nm thickness, which is coated with a further oxidation-preventing layer 4, here again a silicon nitride layer.

Subsequently, the layer 4 is etched away at areas at which, as in this example, source and drain zones are to be produced, whereupon the parts of the silicon layer 3 thus exposed are oxidized throughout the thickness and constitute the oxide layer parts 62. Thus, the structure is obtained which is shown diagrammatically in cross-section in FIG. 46.

The layers 4 and 3 are now locally etched away (see FIG. 47) so that strips from these layers (viewed in cross-section in FIG. 47) remain. By thermal oxidation, edge portions 5 of these strips are then converted into oxide (see FIG. 48).

Figure 49:
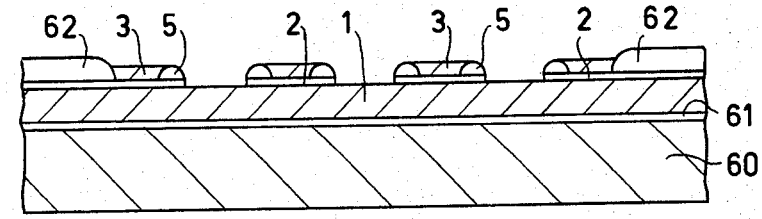
Figure 50:
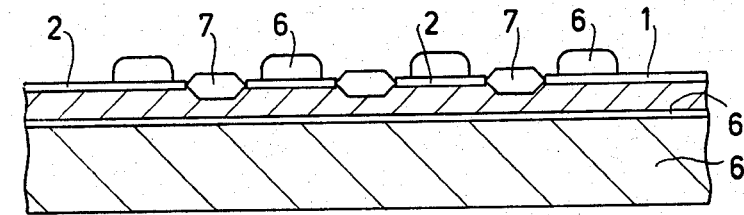

Subsequently, the uncoated parts of the nitride layer 2 and also the nitride layer 4 are etched away (see FIG. 49). The oxidized edge portions 5 and the oxide layers 62 are then removed by etching, whereupon by thermal oxidation the remaining parts of the silicon layer 3 are converted completely into oxide (6), while oxide layers 7 are formed on the exposed parts of the thicker silicon layer 1. Thus, the structure of FIG. 50 is obtained.

The exposed parts of the nitride layer 2 are now removed by etching, whereupon the parts of the silicon layer 1 thus exposed are etched away throughout the thickness of this layer as far as on the oxide layer 61, for example, by plasma etching. Thus, a gate electrode structure is obtained which consists of silicon strips 1A to 1G inclusive, which may be spaced apart by a very small relative distance (<1 μm), which distance is defined by the oxidized edge portions 5, like in the preceding examples. The gate electrodes are coated partly with an oxide layer 7 and partly with a nitride layer 2 and an oxide layer 6 provided thereon and can be contacted outside the plane of the drawing through openings in the layer 7 and the layers 2 and 6, respectively.

Figure 51:
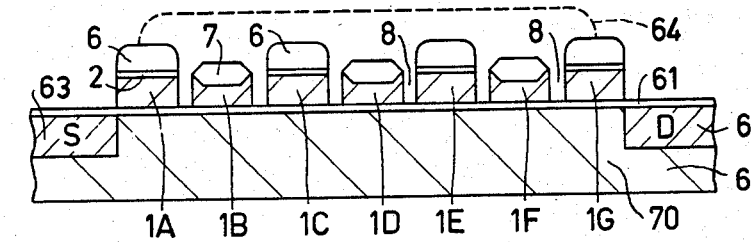

Such a gate electrode structure can be used in a MOS transistor having several control electrodes or a charge-coupled device. In order to form source and drain zones 63 (contacted outside the plane of the drawing), for example, boron ions may be implanted through the oxide layer 61 into the silicon body 60 whilst using, for example, a photoresist mask 64, which need not be aligned accurately and is indicated in FIG. 51 by dotted lines. Of course, it is not essential to the method by means of which the gate electrode structure is formed, whether source and drain zones are produced or not.

A charge-coupled device of the kind shown in FIG. 51 has the great advantage that, because the distance between the gate electrodes is very small, no overlapping gate electrodes at two levels need be used, which reduces inter alia the parasitic capacitances. Of course, the drawing is only schematic and in general a considerably larger number of gate electrodes will be present in a CCD.

A substrate, which in accordance with the invention is provided with slots or grooves, may be used for various purposes. If the substrate is used as a masking layer, the slots or grooves provided therein may be used for doping purposes, for example, for providing very small channel stopper zones. Thus, at the stage of FIG. 6, after the provision of the grooves 8, a boron ion implantation may be carried out substantially at right angles to the surface in order to form small $p^+$-type channel stopper zones 17 in the bottom of the grooves (indicated by dotted lines in FIGS. 6-9). Alternatively, the substrate may be a masking layer of, for example, silicon, which is removed after doping.

The method according to the invention is not limited to the formation of grooves in semiconductor materials, as has been stated above. For illustration, FIGS. 52 to 54 show three stages in the manufacture of a capacitor. In this case (see FIG. 52) the starting material is a substrate region 1 of aluminium foil on which are provided an oxidation-preventing layer 2 of silicon oxide, an oxidizable layer 3 of aluminium and a second oxidation-preventing layer 4 of silicon oxide. According to the method described with reference to FIGS. 10 to 15 the structure of FIG. 53 is obtained therefrom, which corresponds to the structure of FIG. 15 and in which the layer 7 consists of alumina. After selectively etching away the layer 7, for example, by means of a solution of sodium dichromate and HCl in water, the substrate 1 inclusive of the groove 8 is coated by a slight oxidation with a thin alumina layer 70 and a metal layer 71, which, for example, also consists of aluminium, is provided on the assembly (FIG. 54). A capacitor with a dielectric 70 is then obtained between the connection terminals 72 and 73. The groove 8 may have a zigzag form. It is also possible that several grooves are provided. The total effective surface area of the capacitor is strongly enlarged by the presence of the grooves so that a considerably larger capacitance can be realized on the same substrate surface than in the absence of the grooves.

As the selective etchant for silicon oxide a buffered HF solution, as a selective etchant for alumina a solution of phosphoric acid and chromium trioxide in water and as a selective etchant for aluminium a solution of sodium dichromate, HCl and a trace of cupric chloride in water can be used.

The method according to the invention is not limited to the given embodiments. For example, the oxidizable layer may consist of other materials than silicon or aluminium, such as, for example, zirconium or hafnium. In general, for oxidizable layers materials may be used which form oxides which can be etched selectively with respect to these materials. Alternatively, for oxide-preventing layers other materials than silicon nitride may be used, depending upon the material of the substrate region and of the oxidizable layer. When two oxidation-preventing layers are used, it is not necessary for them to consist of the same material provided that the criterium of the selective etchability is fulfilled.

In certain circumstances, an oxidation-preventing layer may be a composite layer and may consist, for example, of two or more juxtaposed layers of different materials, such as silicon nitride and silicon oxide. Thus, in particular when the polycrystalline silicon layer 3 is very thin (for example, 50 nm or less), it may sometimes be advantageous to provide between the layers 3 and 4 (see FIG. 1) a very thin silicon oxide layer, which may be used as an etching step, inter alia when the layer 4 is etched away (for example, by plasma etching).

What is claimed is:

1. A method of providing a narrow groove in a substrate region, the width of the groove being determined in a self-aligning manner, characterized in that on a surface of the substrate region there is provided at least a first oxidation-preventing layer and on this layer an oxidizable layer, in that the oxidizable layer is removed selectively above part of the surface of the substrate region, whereupon an edge portion of the remaining part of the oxidizable layer is selectively oxidized throughout its thickness and the remainder of the oxidizable layer is selectively oxidized at most only through part of its thickness, and in that then at least the uncovered part of the first oxidation-preventing layer is selectively removed, the exposed part of the substrate region is thermally oxidized through part of its thickness and the substrate region is exposed in a self-aligning manner substantially only at the area of the oxidized edge portion and is etched away through at least part of its thickness to obtain the groove, the said remaining part of the oxidizable layer inclusive of the oxidized edge portion being removed.

2. A method as claimed in claim 1, characterized in that after the uncovered part of the first oxidation preventing layer has been removed, the oxidized part of the oxidizable layer is etched away completely, whereupon simultaneously with the thermal oxidation of the exposed part of the substrate region the remaining part of the oxidizable layer is oxidized entirely and by removal of the uncovered part of the first oxidation-preventing layer the underlying part of the substrate region is exposed.

3. A method as claimed in claim 2, characterized in that during the formation of the oxidized edge portion the remainder of the oxidizable layer is also oxidized through part of its thickness.

4. A method as claimed in claim 1, characterized in that the oxidizable layer is provided with a second oxidation-preventing layer which during the oxidation of the said edge portion protects the remainder of the oxidizable layer from oxidation.

5. A method as claimed in claim 4, characterized in that after the said thermal oxidation of the exposed part of the substrate region, the second oxidation-preventing layer and the underlying oxidizable layer are removed, in that then the part of the first oxidation-preventing layer thus exposed is removed and in that then the oxidized edge portion and the thermal oxide layer on the substrate region are etched away, whereupon the substrate region is thermally oxidized again and the underlying part of the substrate region is exposed by removing the uncovered part of the first oxidationpreventing layer.

6. A method as claimed in claim 4, characterized in that after removing the uncovered part of the first oxidation-preventing layer, the oxidized edge portion is etched away, and in that after the thermal oxidation of the substrate region the second oxidation-preventing layer is removed, whereupon during the etching of the groove into the exposed part of the substrate region the remainder of the oxidizable layer is etched away at the same time.

7. A method as claimed in claim 4, characterized in that after the formation of the oxidized edge portion, the second oxidation-preventing layer is etched away completely and the first oxidation-preventing layer is etched away through only part of its thickness, in that then the oxidizable layer is etched away selectively, in that subsequently the parts of the first oxidation-preventing layer which are not located under the oxidized edge portion are removed, whereupon the oxidized edge portion is etched away, and in that then the exposed part of the substrate region is oxidized, whereupon the remaining part of the first oxidation preventing layer is etched away selectively.

8. A method as claimed in claim 1, characterized in that the substrate region consists of a semiconductor material.

9. A method as claimed in claim 1, characterized in that after the groove has been etched, a thermal oxidation is carried out, as a result of which the groove is coated with an oxide layer.

10. A method as claimed in claim 9, characterized in that by the thermal oxidation the groove is filled entirely with oxide.

11. A method as claimed in claim 10, characterized in that the substrate region comprises a layer-shaped first region of a first conductivity type which adjoins the surface and forms a pn-junction with an underlying second region of the second opposite conductivity type, and in that the groove extends throughout the thickness of the layer-shaped region.

12. A method as claimed in claim 11, characterized in that the second region is constituted by a buried layer present on a third semiconductor region of the first conductivity type and in that the groove extends throughout the thickness of the buried layer into the third region.

13. A method as claimed in claim 1, characterized in that the substrate region is constituted by a silicon layer provided on a supporting body, and in that the groove forms a slot-shaped aperture which extends throughout the thickness of this silicon layer.

14. A method as claimed in claim 13, characterized in that the supporting body is a semiconductor body coated at least in part with an insulating layer and in that the parts of the silicon layer separated by the slot or slots constitute at least two gate electrodes of a field effect device which are located on the insulating layer.

15. A method as claimed in claim 14, characterized in that the gate electrodes form part of a chargecoupled device (CCD).

16. A method as claimed in claim 14, characterized in that at a location where a junction between n- and p-type layer parts is to be formed in the silicon layer which constitutes the substrate region, a metal silicide island is provided on the insulating layer at said location prior to providing said silicon layer, said groove being provided above said island.

17. A method as claimed in claim 16, characterized in that an insulating layer capable of withstanding the etching of the groove is provided on the metal silicide island.

18. A method as claimed in claim 13 characterized in that the substrate region with the slots provided therein serves as a masking in a doping process, in which a doping material is provided through the slots in a semiconductor region located under the substrate region.

19. A method as claimed in claim 1, characterized in that a silicon layer is used as the oxidizable layer.

20. A method as claimed in claim 1, characterized in that the oxidation-preventing layers comprise silicon nitride.

* * * * *